(12) United States Patent
Hussain

(10) Patent No.: US 6,341,963 B1
(45) Date of Patent: Jan. 29, 2002

(54) SYSTEM LEVEL TEST SOCKET

(75) Inventor: Rafiqul Hussain, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/610,867

(22) Filed: Jul. 6, 2000

(51) Int. Cl.[7] .............................................. H01R 12/00
(52) U.S. Cl. ............................................ 439/71; 439/66
(58) Field of Search .............................. 439/71, 70, 68, 439/69, 66, 330, 331, 526

(56) References Cited

U.S. PATENT DOCUMENTS

| | | | | |
|---|---|---|---|---|
| 5,109,596 A | * | 5/1992 | Driller et al. | 439/66 |
| 5,475,317 A | * | 12/1995 | Smith | 439/71 |
| 5,702,255 A | * | 12/1997 | Murphy et al. | 439/74 |
| 5,810,607 A | * | 9/1998 | Shih et al. | 439/71 |
| 5,883,788 A | * | 3/1999 | Ondricek et al. | 439/71 |
| 6,016,254 A | * | 1/2000 | Plaff | 439/71 |
| 6,152,744 A | * | 11/2000 | Maeda | 439/71 |
| 6,249,440 B1 | * | 6/2001 | Affolter | 439/71 |

* cited by examiner

Primary Examiner—Tho D. Ta

(57) ABSTRACT

A system level test socket for testing semiconductor packages having non-pin grid array footprints. The test socket having solder pads positioned on the test socket to form electrical connections with corresponding leads on the bottom of the semiconductor package. The test socket has internal connections connecting each solder pad with a corresponding connection on the bottom of the test socket. The test socket is mounted on a burn-in board, thus allowing a semiconductor package having a non-pin grid array footprint to be tested without requiring an interposer for converting the non-pin grid array footprint of the semiconductor package. In addition, the test socket includes guide posts which align with guide slots on a hydraulic cylinder. The hydraulic cylinder compresses the semiconductor package to the test socket thereby ensuring solid connections between the semiconductor package and test socket.

12 Claims, 4 Drawing Sheets

SYSTEM LEVEL TEST SOCKET

FIELD OF THE INVENTION

The present invention relates to a system level test socket for a semiconductor package having a non-pin grid array footprint. The present invention has particular applicability in testing a semiconductor package having either a land grid array footprint or a ball grid array footprint.

BACKGROUND ART

Burn-in boards are used to test semiconductor packages, such as integrated circuit (IC) chips, to ensure that the semiconductor packages are operating in a proper manner. Typically, the semiconductor package to be tested is inserted into a socket mounted on a burn-in board. For example, an IC chip is inserted into an IC socket on a burn-in board. The burn-in board is then placed in a testing chamber and power, ground and test signals are coupled to the burn-in board. The semiconductor packages in the IC chip are then tested for a period of time under stress conditions to ensure that the semiconductor packages are performing according to set standards or specifications.

As long as the semiconductor package has a pin grid array footprint, the semiconductor package can be placed directly into a pin grid array socket on the circuit board. However, semiconductor packages having non-pin grid array footprints, such as land grid array or ball grid array footprints are becoming more commonly employed. Problems arise when these non-pin grid array semiconductor packages need to be tested. In order to test such semiconductor packages, the footprint of the semiconductor package needs to be adapted for connection to the pin grid array socket. Therefore, a device such as an interposer, is used to convert the semiconductor package footprints. For example, a semiconductor package having a ball grid array footprint is inserted into an interposer having a pin grid array and the interposer is inserted into a pin grid array socket on a circuit board. However, using an interposer or other converting device creates a high profile with long electrical connections. Moreover, requiring an additional device unnecessarily increases the chance of a defective component and as a result, can damage the semiconductor package.

Therefore, there is a need for a system level test socket capable of receiving a semiconductor package having either a land grid array footprint or a ball grid array footprint, without requiring an additional component to convert the footprint.

There also exists a need for a simplified methodology for testing a semiconductor package having either a land grid array footprint or a ball grid array footprint, using a system level test socket on a circuit board, where the semiconductor package and socket have a low profile and short electrical paths between the semiconductor package and the circuit board.

SUMMARY OF THE INVENTION

These and other needs are met by embodiments of the present invention which provide method ad apparatus for testing a semiconductor package having either a land grid array footprint or a ball grid array footprint, without requiring an additional component to convert the footprint.

The test socket and method of using the socket of the present invention connect a semiconductor package having a non-pin grid array to a circuit board. The test socket includes a plurality of solder pads, wherein the solder pads are positioned to be aligned with corresponding leads from the non-pin grid array of a semiconductor package and a plurality of corresponding internal leads for connecting the plurality of solder pads to a plurality of leads on the bottom surface of the test socket. The test socket allows for the testing of semiconductor packages having non-pin grid array without having to use an interposer to convert the non-pin grid array. Also, the test socket allows for a lower profile since the interposer is not needed.

The testing system of the present invention includes a test socket for connecting a semiconductor package having a non-pin grid array to a circuit board. The test socket includes a plurality of solder pads, wherein the solder pads are positioned to be aligned with corresponding leads from the non-pin grid array of a semiconductor package and a plurality of corresponding internal leads for connecting the plurality of solder pads to a plurality of leads on the bottom surface of the test socket. The testing system includes one or more test sockets on a circuit board with a fastener for pressing a semiconductor package against a test socket. The testing system allows for a plurality of semiconductor packages having a non-pin grid array to be inserted into the test sockets on a circuit board and tested at the same time.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Current system level test sockets are incapable of receiving a semiconductor package having either a land grid array footprint or a ball grid array footprint. Conventional test sockets for semiconductor packages require a component to convert the footprint of semiconductor package having a non-pin grid array footprint to a pin grid array footprint. Moreover, the component for converting the footprint increases the profile of the test package semiconductor package and as a result, increases the length of the electrical connection between the semiconductor package and the test socket. The present invention addresses and solves these and other problems stemming from conventional test sockets requiring a component to convert the footprint of a semiconductor package having a non-pin grid array footprint.

According to the methodology of the present invention, a system level test socket is able to provide electrical connections between a semiconductor package having a non-pin grid array footprint and the circuit board. Moreover, the system level test socket provides a low profile, thereby providing shorter electrical connections between the semiconductor package and the circuit board.

Figure 1A:
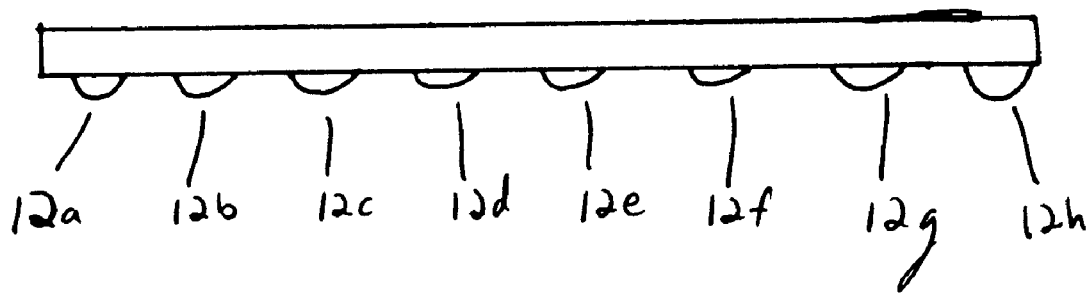
FIG. 1a is a front view of an exemplary semiconductor package having a land grid array footprint.
Figure 1B:
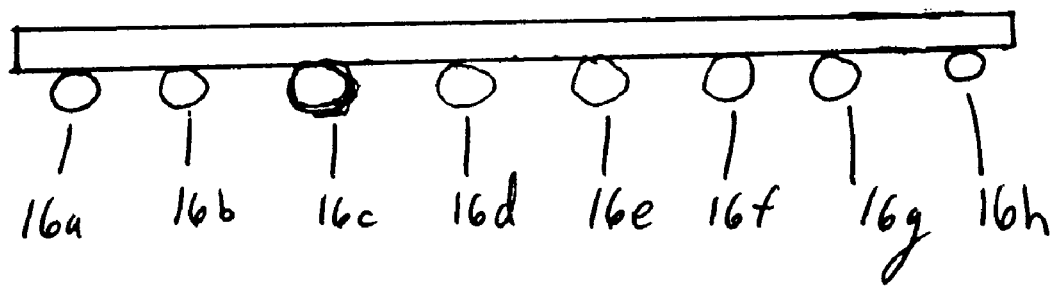
FIG. 1b is a front view of an exemplary semiconductor package having a ball grid array footprint.

Referring to FIGS. 1a and 1b, front views of semiconductor packages having a land grid array footprint and a ball grid array footprint, respectively, are illustrated. As shown, a semiconductor package 10 has a plurality of lands 12a–h on the bottom surface of the semiconductor package 10. Similarly, semiconductor package 14 has a plurality of solder balls 16a–h. The lands 12a–h and solder balls 16a–g provide electrical signals to and from the semiconductor packages 10, 14, respectively.

Figure 2:
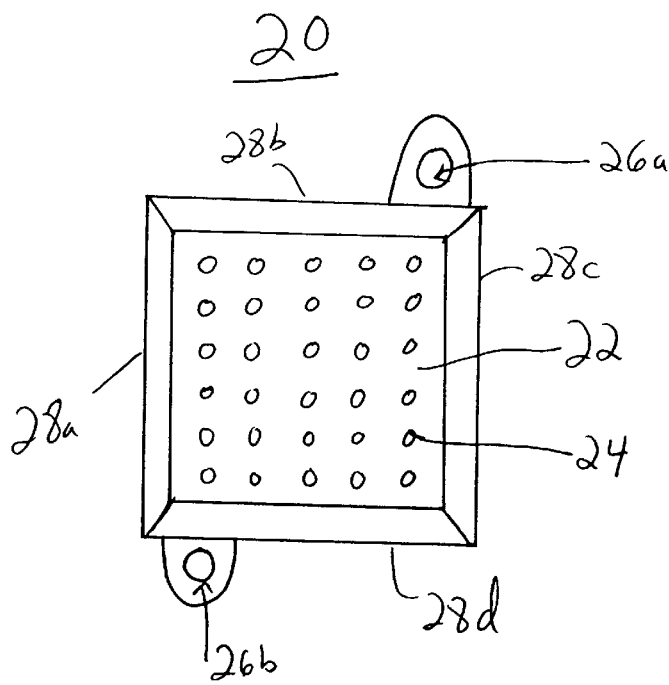
FIG. 2 is top view of an exemplary system level test socket in accordance with an embodiment of the present invention.

Referring to FIG. 2, the top view of a system level test socket in accordance with an embodiment of the present invention is illustrated. As shown, the test socket 20 includes a socket body 22, solder pads 24, and guide pins 26a, 26b. The socket body 22 and guide pins 26a, 26b are preferably made of a metal material, such as stainless steel. The socket body 22 includes walls 28a–d which allow a semiconductor package to be inserted into the cavity created by the walls 28a–d. The solder pads 24 are positioned to align with the footprint of the semiconductor package that will be tested. Therefore, test sockets 20 are designed for semiconductor packages having standard footprints. In addition, a test socket 20 can be custom designed for semiconductor packages having non-standard footprints. The guide pins 26a, 26b are used to guide a hydraulic cylinder having guide slots which fit around the guide pins 26a, 26b. The hydraulic cylinder uses pressure to press a semiconductor package against the test socket 20. In alternate embodiments, the semiconductor package is pressed against the test socket 20 using a fastener, such as a clamp or screwed down fastener. By pressing the semiconductor package onto the test socket 20, the connections or leads on the bottom of the semiconductor package, such as solder balls or lands, are pressed against the solder pads 24 of the test socket 20, thereby ensuring electrical connectivity between them.

Figure 3A:
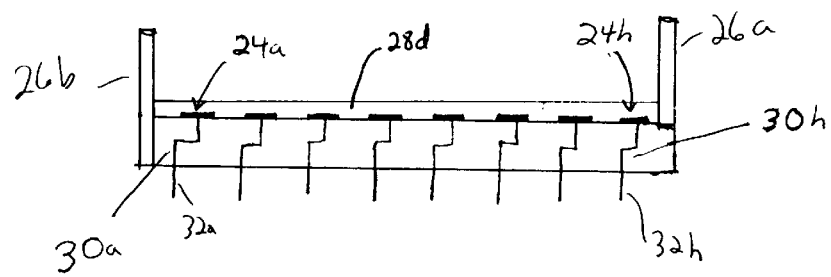
FIG. 3a is a front view of an exemplary system level test socket having a pin grid array in accordance with an embodiment of the present invention.
Figure 3B:
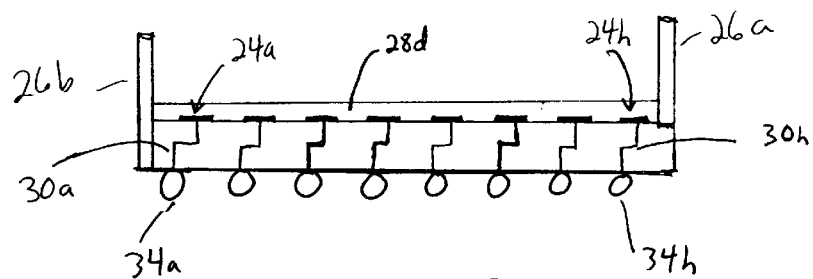
FIG. 3b is a front view of an exemplary system level test socket having a ball grid array in accordance with an embodiment of the present invention.
Figure 3C:
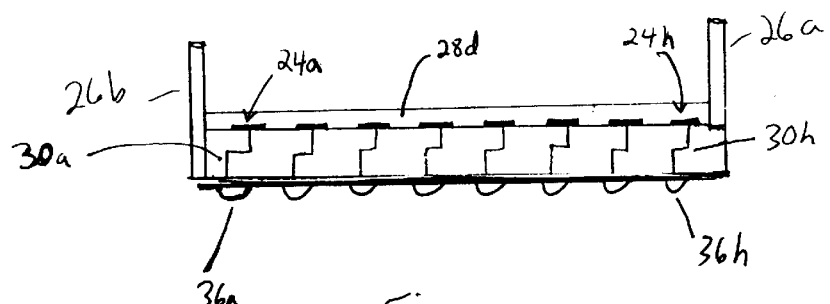
FIG. 3c is a front view of an exemplary system level test socket having a land grid array in accordance with an embodiment of the present invention.

Referring to FIG. 3a, a front view of an exemplary system level test socket having a pin grid array in accordance with an embodiment of the present invention is illustrated. As shown, the test socket 20 includes internal leads 30a–h which provide electrical connections between the leads on the bottom of the non-pin grid array package and the leads on the bottom of the test socket 20. In FIG. 3a, the leads on the bottom of the test socket 20 are pins 32a–h. FIGS. 3b and 3c illustrate solder balls 34a–h and lands 36a–h on the bottom of the test socket 20, respectively. In alternate embodiments, the leads on the bottom of the test socket 20 can be other leads as known in the art. The leads on the bottom of the test socket 20 are used to provide electrical connections between the test socket 20 and a circuit board.

Figure 4:
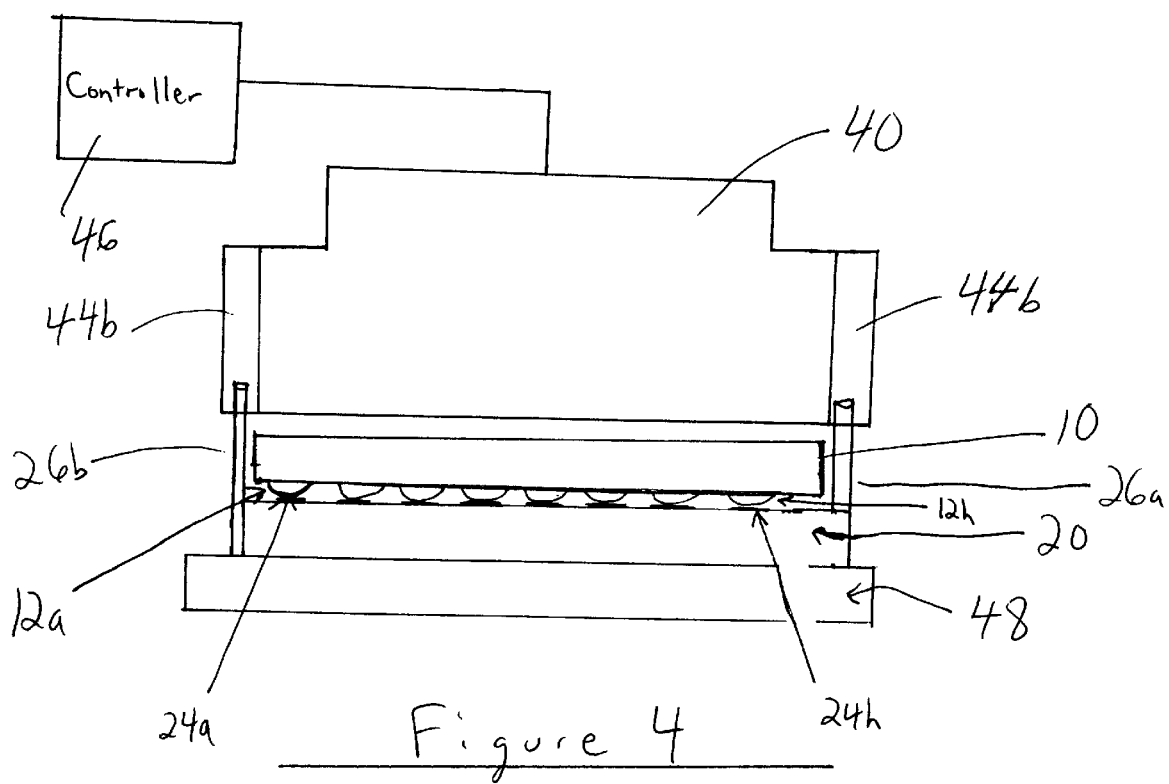
FIG. 4 is a front view of an exemplary testing system with an exemplary system level test socket in accordance with an embodiment of the present invention.

Referring to FIG. 4, a front view of a testing system for testing a semiconductor package in a test socket in accordance with an embodiment of the present invention is illustrated. As shown, a test socket 20 having a semiconductor package 10 with a land grid array footprint is mounted on a circuit board 48. The test socket 20 can be mounted by either soldering it directly to the circuit board 48 or using other methods of attachments known in the art, such as pressure or an elastomer.

In the preferred embodiment, the circuit board 48 is a burn-in board. The circuit board 48 can be a motherboard or a fatherboard which plugs into a motherboard. Therefore, the test socket 20 of the present invention functions as a system test level socket for inserting a semiconductor package into the test socket 20 and to test the semiconductor package in an oven for a period of time under stress conditions such as heat and humidity.

As shown, a hydraulic cylinder 40 having guide slots 44a, 44b is used to press the semiconductor package 10 against the test socket 20. The hydraulic cylinder 40 causes the leads 12a–h on the bottom of the semiconductor package 10 to press against the solder pads 24a–h on the test socket 20, thereby ensuring electrical connectivity between the leads 12a–h on the bottom of the semiconductor package 10 and the solder pads 24a–h of the test socket 20. The amount of pressure applied is controlled by a controller 46 such that the package leads (pins, solder balls, lands, etc.) are not damaged. The guide pins 26a, 26b, are used to guide the hydraulic cylinder 40 onto the test socket 20 with the guide slots 44a, 44b lining up with and sliding over the guide pins 26a, 26b on the test socket 20.

Figure 5:
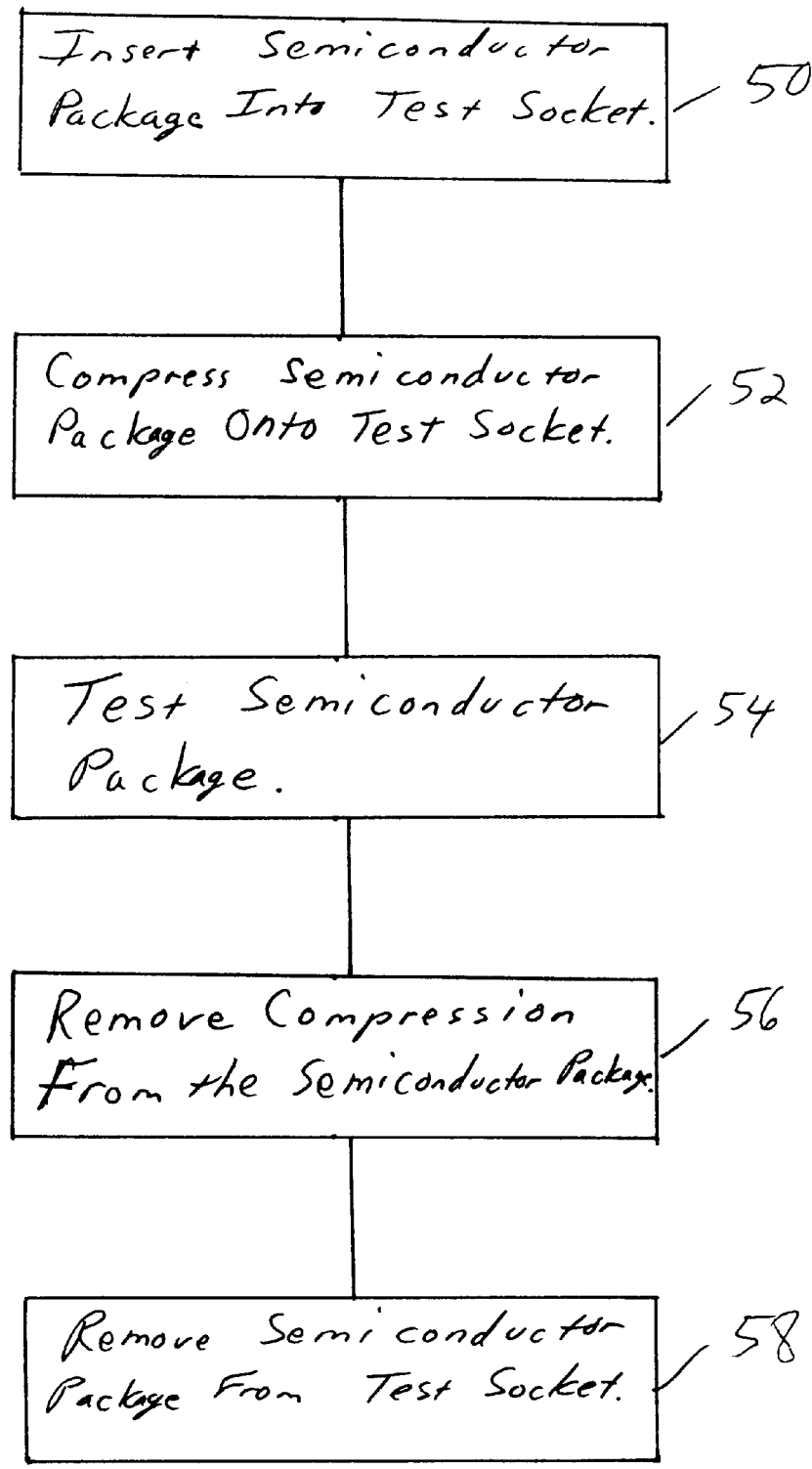
FIG. 5 is a flow diagram of the steps for using an exemplary system level test socket in accordance with an embodiment of the present invention.

Referring to FIG. 5, a flow chart of the steps for using the test socket in accordance with an embodiment of the present invention is illustrated. As shown, the process starts with a semiconductor package being inserted into the test socket mounted on a burn-in board at step 50. The semiconductor package is pressed against the test socket ensuring electrical connectivity between the connections on the bottom of the semiconductor package and the solder pads in the test socket at step 52. In some embodiments, it is not necessary to press the semiconductor package against the test socket as long as there are adequate connections between the semiconductor package and test socket. The semiconductor package is electrically tested at step 54. The pressure is removed from the semiconductor package at step 56. The semiconductor package is removed from the test socket at step 58.

The present invention allows for the testing of semiconductor packages having non-pin grid array footprints without requiring an interposer to convert the footprint of the semiconductor package to a pin grid array footprint so it can be inserted into a pin grid array test socket. Therefore, the test socket of the present invention provides connections between the semiconductor package having a non-pin grid array footprint and the circuit board on which the test socket is mounted. In addition, the test socket includes guide pins to assist in guiding a hydraulic cylinder onto the test socket to compress the semiconductor package to the test socket.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A test socket for connecting a semiconductor package having a non-pin grid array to a circuit board, comprising:

a plurality of solder pads, wherein the solder pads are positioned to be aligned with corresponding leads from the non-pin grid array of a semiconductor package;

a plurality of corresponding internal leads for connecting the plurality of solder pads to a plurality of leads on the bottom surface of the test socket;

at least one guide pin aligning a hydraulic cylinder with the test socket to allow the hydraulic cylinder to press the semiconductor package against the test socket in an aligned manner; and a controller controlling the hydraulic cylinder so that the pressure applied by the hydraulic cylinder does not result in damage to the leads of the semiconductor package.

2. The test socket of claim 1, wherein the plurality of leads is a pin grid array on the bottom surface of the test socket.

3. The test socket of claim 1, wherein the plurality of leads is a ball grid array on the bottom surface of the test socket.

4. The test socket of claim 1, wherein the plurality of leads is a land grid array on the bottom surface of the test socket.

5. The test socket of claim 1, wherein the solder pads are positioned to align with lands from the semiconductor package having a land grid array.

6. The test socket of claim 1, wherein the solder pads are positioned to align with solder balls from the semiconductor package having a ball grid array.

7. The test socket of claim 1, wherein the test socket is mounted on the circuit board.

8. The test socket of claim 7, wherein the circuit board is a fatherboard.

9. The test socket of claim 7, wherein the circuit board is a motherboard.

10. A testing system having one or more test sockets, where the test socket connects a semiconductor package having a non-pin grid array to a circuit board, the testing system comprising:

one or more test sockets, each including a plurality of solder pads, wherein the solder pads are positioned to be aligned with corresponding leads from the non-pin grid array of the semiconductor package;

a plurality of corresponding internal leads for connecting the plurality of solder pads to a plurality of leads on the bottom surface of said each test socket;

at least one guide pin aligning a hydraulic cylinder with said each test socket; and a controller controlling the hydraulic cylinder, wherein the circuit board includes each of the one or more test sockets, the hydraulic cylinder presses the semiconductor package against the said each test socket, and the controller controls the hydraulic cylinder so that the pressure applied by the hydraulic cylinder does not result in damage to the leads of the semiconductor package.

11. The testing system of claim 10 wherein the hydraulic cylinder further comprises at least one guide slot which is used to align the at least one guide pin with at least one corresponding guide pin.

12. A method for testing semiconductor packages comprising the steps of:

inserting a semiconductor package having a non-pin grid array into a test socket mounted on a circuit board;

aligning at least one guide slot on a hydraulic cylinder with a corresponding guide post on the test socket;

pressing the semiconductor package against the test socket and controlling the pressing so as not to result in damage to leads of the semiconductor package; and testing the semiconductor package by supplying power, ground and test signals to the semiconductor package through the test socket.

* * * * *